United States Patent
Nomura et al.

[11] Patent Number: 6,083,340
[45] Date of Patent: Jul. 4, 2000

[54] PROCESS FOR MANUFACTURING A MULTI-LAYER CIRCUIT BOARD

[75] Inventors: Kazuo Nomura; Ichiro Ishiyama; Koji Higashi; Masaki Kato; Ichiro Nagare; Hiroyuki Kurokawa; Yozo Ohara, all of Toyama-ken, Japan

[73] Assignee: Hokuriku Electric Industry Co., Ltd., Toyama Pref., Japan

[21] Appl. No.: 09/124,692

[22] Filed: Jul. 29, 1998

Related U.S. Application Data

[63] Continuation of application No. 08/807,557, Feb. 28, 1997, abandoned.

[51] Int. Cl.⁷ ............... B32B 31/20; H05K 3/46
[52] U.S. Cl. .......... 156/253; 156/307.7; 156/278; 29/852; 427/97
[58] Field of Search ............... 156/253, 278, 156/279, 307.7; 29/852; 427/97

[56] References Cited

U.S. PATENT DOCUMENTS

| | | |
|---|---|---|
| 4,388,136 | 6/1983 | Huie et al. . |
| 4,545,119 | 10/1985 | Tanazawa . |
| 4,668,532 | 5/1987 | Mosian et al. . |
| 4,891,069 | 1/1990 | Holtzman et al. . |
| 4,970,624 | 11/1990 | Arneson et al. ............... 361/398 |
| 5,045,381 | 9/1991 | Suzuki et al. . |
| 5,047,114 | 9/1991 | Frisch et al. . |
| 5,435,877 | 7/1995 | Ishii et al. . |
| 5,450,290 | 9/1995 | Boyko et al. ............... 361/792 |
| 5,495,394 | 2/1996 | Kornfeld et al. ............... 361/764 |
| 5,528,000 | 6/1996 | Allardyce et al. . |
| 5,640,047 | 6/1997 | Nakashima ............... 257/738 |
| 5,672,226 | 9/1997 | Deardorf . |

FOREIGN PATENT DOCUMENTS

| | | |
|---|---|---|
| 194697 | 8/1990 | Japan . |
| 37879 | 2/1991 | Japan . |
| 8-64966 | 3/1996 | Japan . |
| 8-172271 | 7/1996 | Japan . |
| 8-330732 | 12/1996 | Japan . |

*Primary Examiner*—Curtis Mayes
*Attorney, Agent, or Firm*—Rankin, Hill, Porter & Clark LLP

[57] ABSTRACT

A multi-layer circuit board capable of reducing an electrical resistance between circuit patterns positioned inside the circuit board and a through-hole connection conductor. A plurality of circuit patterns are superposed on each other with a plurality of insulating layers being alternately interposed therebetween in turn. A solution in which ultrafine metal particles of the independent dispersion type such as silver, gold, palladium or the like are contained in a colloid-like manner is applied so as to extend from one of lands through an inner surface of a through-hole to the other land. Then, the solution is calcined to form a metal particle film, The metal particle film is coated thereon with a conductive paste such as a resin/silver paste or the like, which is then calcined to form a conductive paste layer.

9 Claims, 3 Drawing Sheets

PROCESS FOR MANUFACTURING A MULTI-LAYER CIRCUIT BOARD

This application is a continuation of application Ser. No. 08/807,557 filed Feb. 28, 1997, now abandoned.

BACKGROUND OF THE INVENTION

This invention relates to a multi-layer circuit board, and more particularly to a multi-layer circuit board wherein a plurality of circuit boards are superposed through a plurality of insulating layers in order and electrically connected to each other via conductive through-hole sections.

Conventionally, a multi-layer circuit board wherein a plurality of circuit patterns are laminated or superposed on each other through a plurality of insulating layers in turn is often formed with through-hole connection conductors for electrically connecting the circuit patterns to each other therethrough. For example, Japanese Patent Application Laid-Open Publication No. 194697/1990 (2-194697) discloses techniques wherein through-hole connection conductors made of a conductive material by plating each are arranged on an inner surface of each of through-holes formed so as to commonly extend through both insulating layers and circuit patterns. Other techniques for forming through-hole connection conductors are also proposed wherein a conductive paste made of resin and a conductive material such as silver particles or the like contained in the resin is applied to an inner surface of each of through-holes and then subject to calcination, resulting in a through-hole conductor being provided.

Of the conventional techniques described above, the former techniques require a step of carrying out plating of a conductive material on the inner surface of each of the through-holes. Unfortunately, the step is highly complicated and requires much time and labor. The latter techniques fail to permit an end surface of each of the circuit patterns positions inside the multi-layer circuit board to be fully contacted with the through-hole connection conductor, to thereby increase an electrical resistance between both. This would be due to the fact that the prior art causes the inner surface of the through-hole to be rendered coarse during formation of the through-hole, to thereby fail to permit silver particles contained in the conductive paste to be satisfactorily contacted with the end surface of the circuit pattern exposed to the inner surface of the through-hole. Also, the silver particles are generally formed into a scale-like shape having an average diameter as large as 10 μm or more. This fails to provide a sufficient contact area between the silver particles and the end surface of the circuit pattern formed of a copper foil and positioned in the through-hole, because the circuit pattern is formed into a thickness as small as about tens of microns (μm). This causes an electrical resistance between each of the circuit patterns positioned inside the multi-layer circuit board and each of the through-hole connection conductors to be as high as hundreds of ohms (Ω).

SUMMARY OF THE INVENTION

The present invention has been made in view of the foregoing disadvantage of the prior art.

Accordingly, it is an object of the present invention to provide a multi-layer circuit board which is capable of significantly reducing an electrical resistance between a circuit pattern positioned inside the multi-layer circuit board and a through-hole connection conductor.

In accordance with the present invention, a multi-layer circuit board which includes a plurality of insulating layers and a plurality of circuit patterns alternately laminated on each other in turn is provided. The insulating layers and circuit patterns are formed with through-holes in a manner to commonly extend therethrough. The multi-layer circuit board includes through-hole connection conductors each arranged on an inner surface of each of the through-holes and around openings of each of the through-holes, to thereby connect the circuit patterns to each other therethrough. The through-hole connection conductors each are made of a metal particle film formed of ultrafine metal particles of the independent dispersion type.

In a preferred embodiment of the present invention, the multi-layer circuit board further includes a conductive paste layer made of a conductive paste and arranged on the metal particle film.

Also, in accordance with the present invention, a multi-layer circuit board is provided which includes a plurality of insulating layers and a plurality of circuit patterns alternately laminated on each other in turn to form a laminate. The insulating layers and circuit patterns are formed with through-holes in a manner to commonly extend therethrough. The multi-layer circuit board includes recesses each formed between each of the circuit patterns and each of the insulating layers arranged adjacently to each other and positioned inside the laminate. The recesses each are arranged so as to be open to both a surface of the circuit pattern and the through-hole. The multi-layer circuit board also includes through-hole connection conductors each arranged on an inner surface of each of the through-holes and around openings of each of the through-holes, to thereby connect the circuit patterns to each other therethrough. The through-hole connection conductors each are made of a metal particle film formed of ultrafine metal particles of the independent dispersion type.

Further, in accordance with the present invention, a multi-layer circuit board is provided. The circuit board includes an inner substrate, first and second copper layers respectively arranged on both surfaces of the inner substrate, and third and fourth copper layers respectively laminatedly arranged on both sides of the inner substrate through prepregs.

The inner substrate, prepregs and first to fourth copper layers are formed with through-holes so as to commonly extend therethrough. The circuit board further includes through-hole connection conductors each formed on an inner surface of each of the through-holes and around openings of each of the through-holes. The through-hole connection conductors each include a metal particle film which is formed by applying colloidal dispersion to the inner surface of the through-hole and a circumference of the openings of the through-hole and then calcining the dispersion. The dispersion has ultrafine metal particles of 100 Å or less independently dispersed therein without agglomerating together.

In addition, in accordance with the present invention, a multi-layer circuit board is provided. The multi-layer circuit board includes a plurality of insulating layers and a plurality of circuit patterns alternately laminated on each other in turn to form a laminate. The insulating layers and circuit patterns are formed with through-holes so as to commonly extend therethrough. The circuit board includes recesses each formed between each of the circuit patterns and each of the insulating layers arranged adjacently to each other and positioned inside the laminate. The circuit board also includes through-hole connection conductors each arranged on an inner surface of each of the through-holes and around openings of each of the through-holes, to thereby connect the circuit patterns to each other therethrough.

Moreover, in accordance with the present invention, a multi-layer circuit board is provided. The multi-layer circuit board includes an inner substrate, first and second copper layers arranged on both surfaces of the inner substrate, respectively, and third and fourth copper layers laminatedly arranged on both sides of the inner substrate through prepregs, respectively. The inner substrate, prepregs and first to fourth copper layers are formed with through-holes so as to commonly extend therethrough. The circuit board also includes through-hole connection conductors each formed on an inner surface of each of the through-holes and around openings of each of the through-holes.

BRIEF DESCRIPTION OF THE DRAWINGS

These and other objects and many of the attendant advantages of the present invention will be readily appreciated as the same becomes better understood by reference to the following detailed description when considered in connection with the accompanying figures; wherein.

DETAILED DESCRIPTION OF THE PREFERRED EMBODIMENTS

Now, a multi-layer circuit board according to the present invention will be described hereinafter with reference to the accompanying figures.

Figure 1:
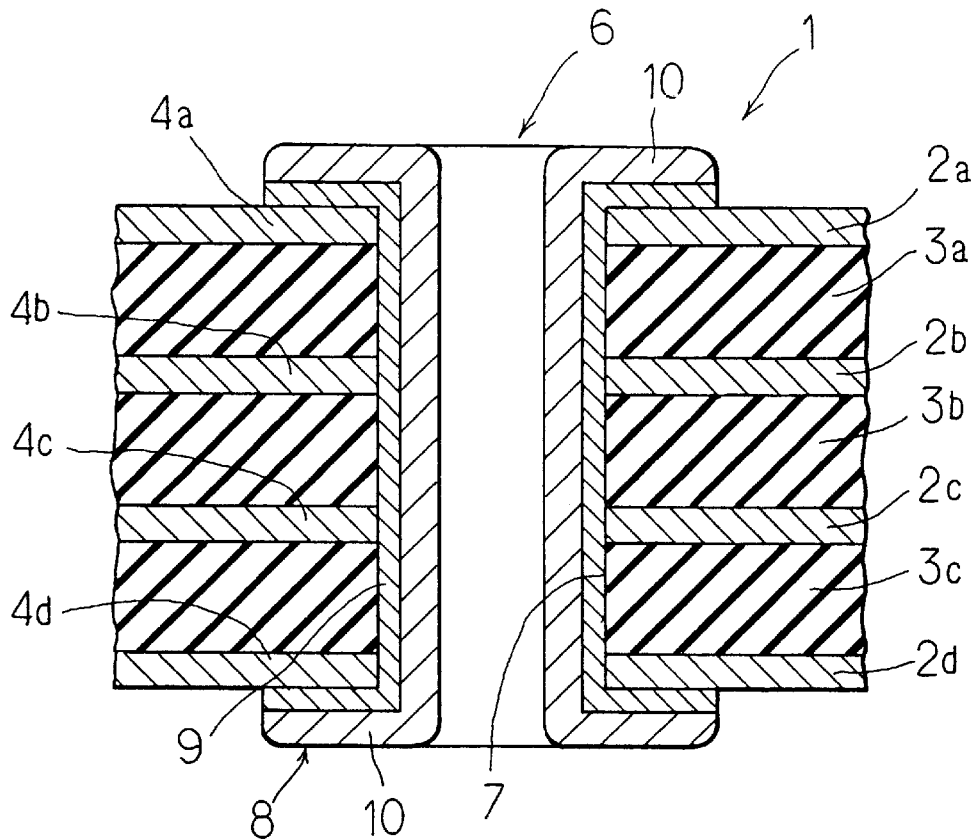
FIG. 1 is a fragmentary enlarged vertical sectional view showing a through-hole formed in an embodiment of a multi-layer circuit board according to the present invention.
Figure 2:
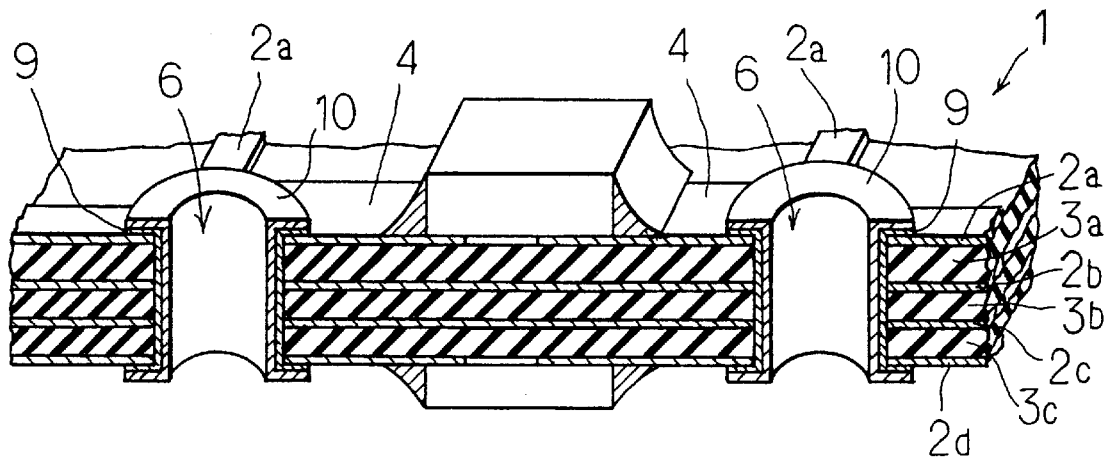
FIG. 2 is a fragmentary vertical sectional view of the multi-layer circuit board shown in FIG. 1.

Referring first to FIGS. 1 and 2, an embodiment of a multi-layer circuit board according to the present invention is illustrated. A multi-layer circuit board of the illustrated embodiment which is generally designated at reference numeral 1 is generally constructed into a laminate structure by superposing or laminating four circuit boards 2a to 2d on each other with three cured prepregs 3a to 3c being alternately interposed therebetween. The circuit patterns 2a to 2d each may be formed of a copper foil into a thickness of tens of microns ($\mu$m). The prepregs 3a to 3c may be made of an insulating sheet formed of imide resin. Alternatively, it may be made of a woven fabric or a non-woven fabric made of a paper-containing glass fiber or a resin fiber and impregnated with thermosetting resin such as epoxy or the like. The prepregs 3a to 3c each may be preferably formed into a thickness of 0.06 to 0.4 mm upon curing. The prepregs thus cured each constitute an insulating layer. The circuit patterns 2a to 2d include lands 4a to 4d, respectively. The multi-layer circuit board 1 is formed with through-hole conductive sections 6 so as to extend through the lands 4a to 4d.

The through-hole conductive sections 6 each are constructed by forming a through-hole connection conductor 8 on an inner surface of each of through-holes 7 formed so as to extend through the multi-layer circuit board 1. The through-holes 7 each may be formed into a diameter of 0.1 to 1.0 mm in diameter. The through-hole connection conductors 8 each may be made of a metal particle film 9 and a conductive paste layer 10.

The metal particle film 9 may be made of ultrafine metal particles of the independent dispersion type into a thickness of 0.25 to 2.00 $\mu$m. The ultrafine metal particles used may have a diameter of 100 Å or less. Preparation of the metal particle film 9 will be described hereinafter. The metal particle film 9 is formed so as to electrically connect the lands 4a to 4d of the circuit patterns 2a to 2d to each other. The conductive paste layer 10 is formed of a conductive paste such as a rein/silver paste so as to cover the metal particle film 9.

Now, the manner of manufacturing of the multi-layer circuit board 1 will be described.

First, a copper-clad substrate is prepared by applying a copper foil onto each of both surfaces of the prepreg 3b. Then, both copper foils of the copper-clad substrate are subject to etching of a predetermined pattern, so that the circuit patterns 2b and 2c are formed on both surfaces of the prepreg 3b, respectively. The substrate thus provided with the circuit patterns 2b and 2c constitutes an inner substrate. Then, the inner substrate is laminatedly formed on the circuit patterns 2b and 2c thereof with the prepregs 3a and 3c, respectively, followed by lamination of a copper foil on each of the prepregs 3a and 3c, to thereby provide a laminate. The laminate is then heated while keeping a pressure applied thereto in a direction of lamination thereof, to thereby cure the prepregs 3a and 3c and bond the copper foils to the prepregs. Thereafter, the copper foils on both surfaces are subject to etching, so that predetermined circuit patterns 2a and 2d may be formed on surfaces of the prepregs 3a and 3c.

Subsequently, the through-holes 7 are formed. This may be carried out by irradiating laser beams to a region between a center of the land 4a of the circuit pattern 2a and that of the land 4d of the circuit pattern 2d. Alternatively, the through-holes 7 each may be formed by means of a punching tool such as a punch, a drill or the like, or an NC machine. Then, air, etching liquid or the like is sprayed onto the inner surface of the through-hole 7 to remove shavings of the cured prepreg and/or those of the copper foil from the inner surface. Thereafter, a dispersion which contains ultrafine metal particles of the independent dispersion type such as silver, gold, palladium or the like in the form of colloid is applied so as to extend from the land 4a through the inner surface of the through-hole 7 to the land 4d. The term "independent dispersion type" indicates that particles disperse independently from each other without agglomerating together. Such dispersions commercially available include an ultrafine metal particle product sold under a trademark "ULVAC" by Sinku Yakin Kabushiki Kaisha having a principal place of business at 516 Yokota, Sanbumachi, Sanbu-gun, Chiba-ken, Japan. Application of the dispersion to the inner surface of the through-hole 7 may be carried out by repeating access of a pin having the dispersion applied thereto to an interior of the through-hole 7. Alternatively, it may be carried out by spraying of the dispersion into the through-hole 7 or introduction of the dispersion into the through-hole 7 by suction. The dispersion is applied to, in addition to the inner surface of the through-hole, the lands 4a and 4d arranged on a periphery of openings on both sides of the through-hole 7.

Then, the laminate is placed in an oven at about 250° C. to subject the applied dispersion to calcination, to thereby form the metal particle film 9. The metal particle film 9 is formed of inherently non-agglomerative ultrafine metal particles, resulting in effectively entering fine recesses formed on a portion of the circuit patterns 2b and 2c of the inner substrate exposed to the through-hole 7, leading to an increase in contact area between the metal particle film 9 and the circuit patterns 2b and 2c. This permits an electric resistance between the metal particle film 9 and the circuit patterns 2b and 2c to be significantly reduced. This is likewise true of an electrical resistance between the metal particle film 9 and the circuit patterns 2a and 2d.

Then, a conductive paste such as a resin/silver paste or the like is applied onto the metal particle film 9 on the inner surface of each of the through-holes 7 and the metal particle film 9 on the periphery of the opening of each end of the through-hole 7 by suction or by means of a pin or the like. The resin/silver paste is a paste wherein silver particles which have a particle diameter larger than the ultrafine metal particles and agglomerate together are dispersed in thermosetting resin. Then, the applied conductive paste is calcined at about 150° C., to thereby provide each of the conductive paste layers 10, so that the multi-layer circuit board of the illustrated embodiment may be provided. Such arrangement permits the conductive paste layer 10 to be contacted with a substantially whole upper surface of the metal particle film 9, leading to a decrease in electrical resistance between the conductive paste layer 10 and the metal particle film 9.

Figure 3:
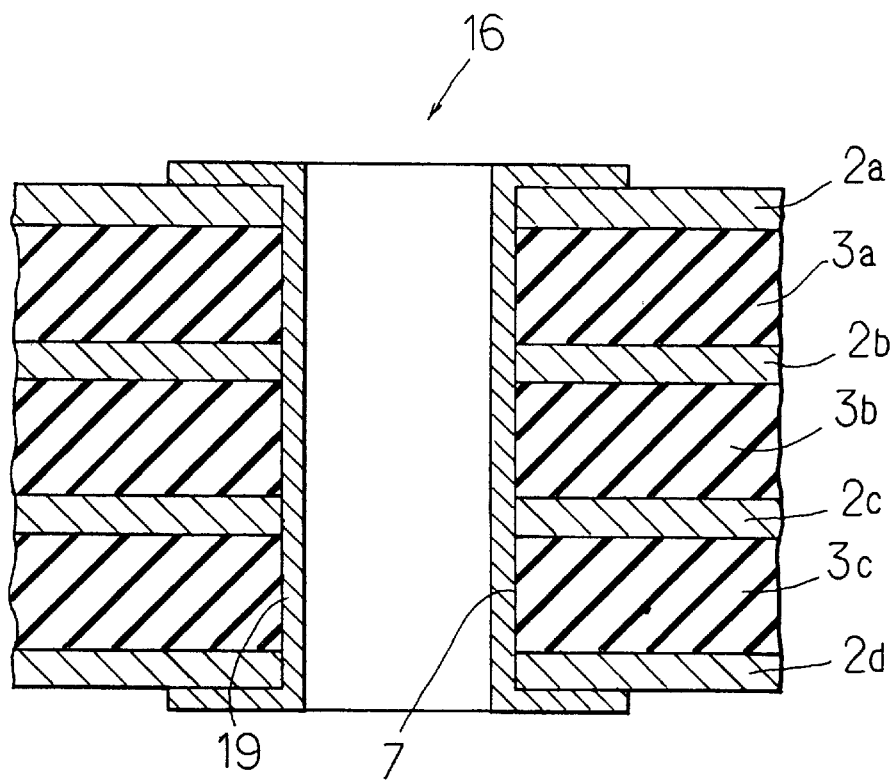
FIG. 3 is a fragmentary enlarged vertical sectional view showing a through-hole formed in another embodiment of a multi-layer circuit board according to the present invention.

The present invention may be constructed in such a manner as shown in FIG. 3, which illustrates another embodiment of a multi-layer circuit board according to the present invention. In the embodiment of FIG. 3, a through-hole connection conductor in each of through-holes 16 is formed of only a metal particle film 19. In this instance, the metal particle film 19 is preferably formed into a relatively increased thickness as large as 1 to 2 μm. A material for each of an ultrafine metal particle and a conductive paste may be selected as desired.

Figure 4:
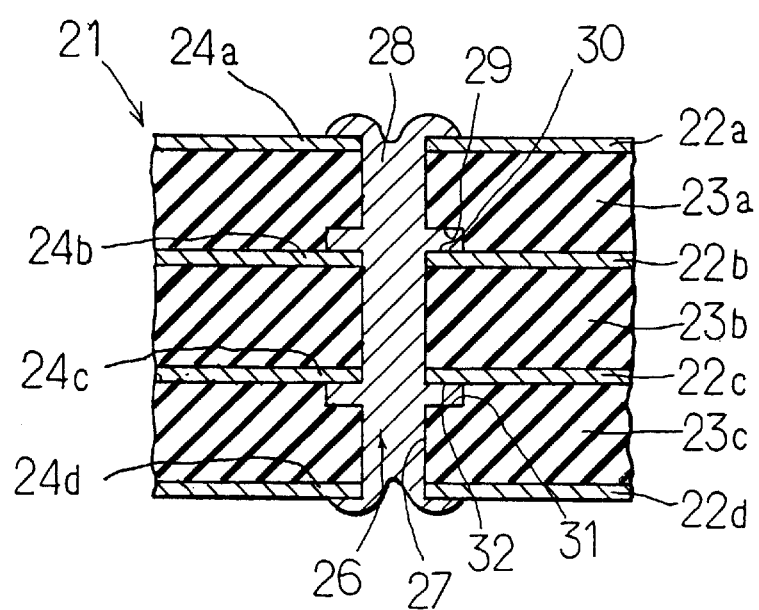
FIG. 4 is a fragmentary enlarged vertical sectional view showing a through-hole formed in a further embodiment of a multi-layer circuit board according to the present invention.

Referring now to FIG. 4, a further embodiment of a multi-layer circuit board according to the present invention is illustrated. A multi-layer circuit board of the illustrated embodiment which is generally designated at reference numeral 21 is likewise so constructed that four circuit patterns 22a to 22d and three cured prepregs 23a to 23c are alternately superposed or laminated on each other in turn. The circuit patterns 22a to 22d each are formed of a copper foil into a thickness of tens of microns (μm). The prepregs 23a to 23c may be made of a sheet formed of a woven fabric or a non-woven fabric made of glass-epoxy resin or phenolic resin and impregnated with thermosetting resin. The prepregs 23a to 23c each may be preferably formed into a thickness of 0.06 to 0.4 mm upon curing. The prepregs thus cured each constitute an insulating layer. The circuit patterns 22a to 22d include lands 24a to 24d, respectively. The multi-layer circuit board 21 is formed with through-hole conductive sections 26 so as to extend through the lands 24a to 24d.

The though-hole conductive sections 26 each are constructed by forming a through-hole connection conductor 28 on an inner surface of each of through-holes 27 arranged so as to extend through the multi-layer circuit board 21. Between the patterns 22b and 22c positioned inside the multi-layer circuit board 21 and the prepregs or insulating layers 23a and 23c adjacent to the circuit patterns, recesses 29 and 31 are formed in a manner to be open to a part of a surface of the circuit patterns 22b and 22c and the through-hole 27, respectively. The recesses 29 and 31 thus formed permit the lands 24b and 24c of the circuit patterns 22b and 22c to be provided with annular exposed portions 30 and 32 contacted with the through-hole conductor 28, respectively. The recesses 29 and 31 thus formed are charged with a part of the through-hole connection conductor 28, so that the through-hole connection conductor 28 may be connected to the exposed portion 30 of the circuit pattern 22b in the recess 29 and the exposed portion 32 of the circuit pattern 22c in the recess 31. The through-hole connection conductor 28 may be formed as in the first embodiment described above.

Now, manufacturing of the multi-layer circuit board 21 of the illustrated embodiment will be described. First, a copper foil is applied to each of both surfaces of the prepreg 23b, to thereby prepare a copper-clad substrate. Then, the thus-applied copper foils are subject to etching to form the circuit patterns 22b and 22c on both surfaces of the prepreg 23b. Then, the prepreg 23a formed with the recess 29 and the prepreg 23c formed with the recess 31 are superposed on the circuit patterns 22b and 22c, respectively. The superposition is carried out while aligning the recesses 29 and 31 with each other. Then, a copper foil is further superposed on each of the prepregs 23a and 23c, to thereby provide a laminate. Subsequently, the laminate is heated while being pressurized in a direction of lamination, to thereby cure thermosetting resin contained in the prepregs 23a and 23c, resulting in the copper foils being joined to the prepregs 23a and 23c. Then, the copper foils are subject to etching, so that the circuit patterns 22a and 22d are formed on the prepregs 23a and 23c, respectively.

Then, the lands 24a to 24d of the circuit patterns 22a to 22d each are formed at a center thereof with the through-hole 27. The through-hole 27 is formed therein with the through-hole connection conductor 28 as in the first embodiment described above. The above-described formation of the recesses 29 and 31 leads to an increase in contact surface between the through-hole 27 and the through-hole connection conductor 28, so that the conductor may be made of only a resin/silver paste.

In the multi-layer circuit board of the illustrated embodiment, the through-hole connection conductor 28 is connected to both the exposed portion 30 of the circuit pattern 22b and the exposed portion 32 of the circuit pattern 22c, so that electrical connection between the circuit patterns 22b and 22c and the through-hole connection conductor 28 may be ensured even when the circuit patterns 22b and 22c arranged inside the multi-layer circuit board 21 are formed into a reduced thickness.

Figure 5:
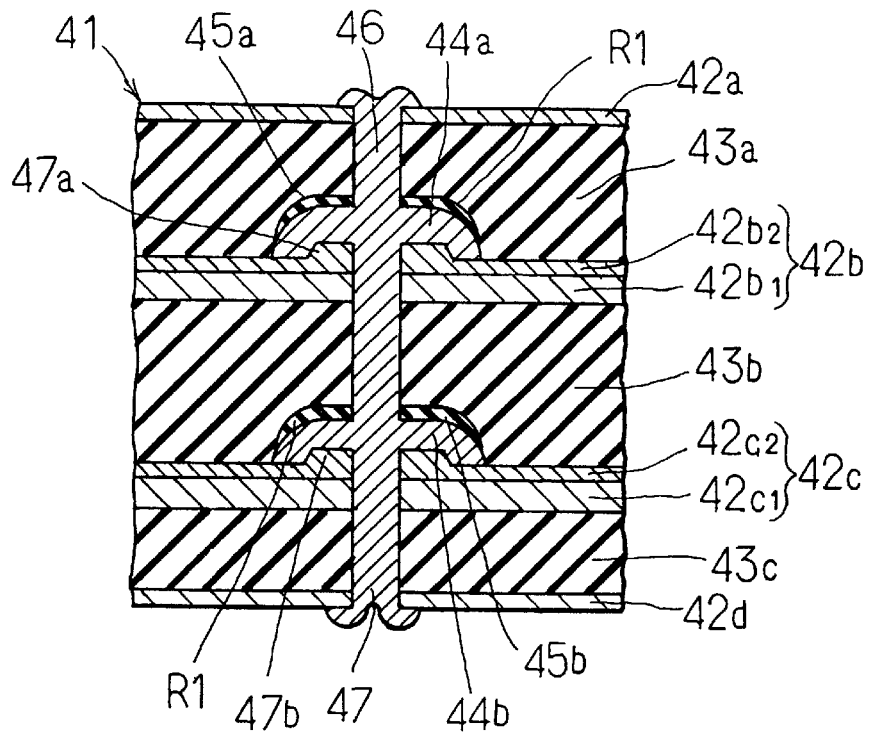
FIG. 5 is a fragmentary enlarged vertical sectional view showing a through-hole formed in still another embodiment of a multi-layer circuit board according to the present invention.

Formation of the recesses 29 and 31 at the prepregs 23a and 23c may be practiced in a variety of ways. For example, the formation may be carried out in such a manner as shown in FIG. 5, which illustrates still another embodiment of a multi-layer circuit board according to the present invention, which is in the form of a multi-layer circuit board 41. In the multi-layer circuit board 41, heat-shrinkable resin R1 may be applied or stuck to prepregs, to thereby be shrunk by heat for curing the prepregs, resulting in recesses 44a and 44b being formed. The heat-shrinkable resins include vinyl chloride resin, cross-linked polyethylene resin, silicone resin and the like. Also, circuit patterns 42b and 42c may be formed with projections 47a and 47b in a manner to project into the recesses 44a and 44b, respectively, which are connected to a through-hole connection conductor 46. In the embodiment of FIG. 5, the inner circuit patterns 42b and 42c are formed of a combination of a copper foil pattern 42b1 and a conductive paste pattern 42b2 for covering the copper foil pattern 42b1 and a combination of a copper foil pattern 42c1 and a conductive paste pattern 42c2 for covering the copper foil pattern 42c1, respectively. The conductive paste patterns 42b2 and 42c2 are formed with the projections 47a and 47b, respectively.

Such construction of the illustrated embodiment permits the recesses 44a and 44b to be positively and readily formed because it is merely required to arrange heat-shrinkable resin at predetermined positions on the prepregs. Also, formation of the projections 47a and 47b on the circuit patterns in a manner to project into the recesses 44a and 44b leads to an increase in contact area between the circuit patterns and the through-hole connection conductor 46, to thereby ensure more satisfactory electrical connection therebetween.

Figure 6:
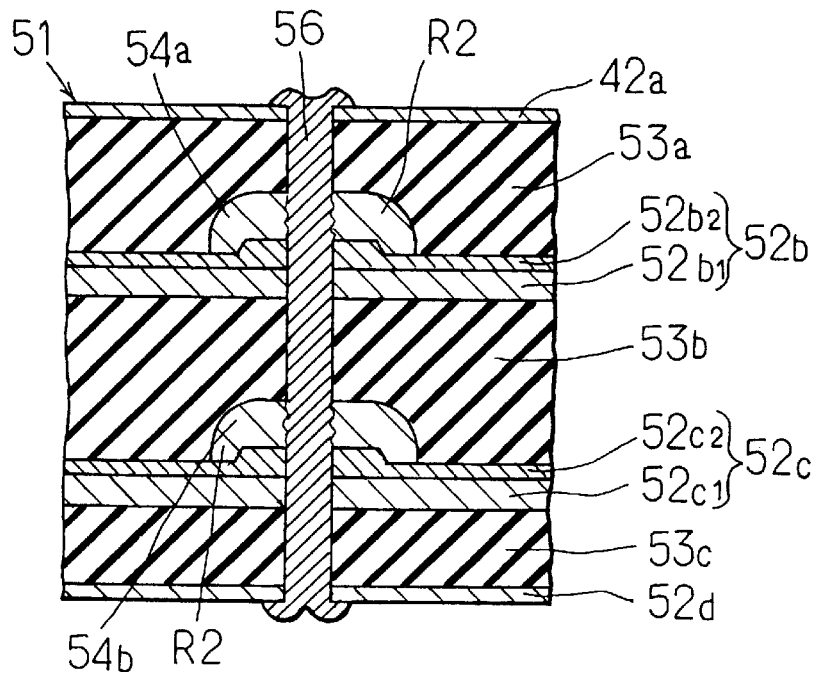
FIG. 6 is a fragmentary enlarged vertical-sectional view showing a through-hole formed in a still further embodiment of a multi-layer circuit board according to the present invention.

Referring now to FIG. 6, a still further embodiment of a multi-layer circuit board according to the present invention is illustrated. In a multi-layer circuit board of the illustrated embodiment which is generally designated at reference numeral 51, porous resin R2 may be applied or stuck to prepregs and foamed or expanded by heat for curing the prepregs, resulting in recesses 54a and 54b being formed and a part of a though-hole connection conductor 56 being introduced into perforations of the porous resin R2. This permits the through-hole connection conductor 56 to be connected to circuit patterns 52b and 52c through the perforations of the porous resin R2. Resin which is adapted to generate gas upon decomposition at an elevated temperature or resin which is adapted to be dissolved in a low-boiling solvent and foamed by heat for curing the prepregs may be used as the porous resin. For example, the porous resin may be prepared by dissolving silicone resin, polyethylene resin, polyolefin resin, vinyl chloride resin, polypropylene resin or the like in epoxy resin. The porous resin may have a conductive material such as carbon black, silver, copper or the like added thereto. Use of such porous resin facilitates formation of the recesses because it is merely required to arrange the porous resin at predetermined positions on the prepregs.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed:

1. A process for manufacturing a multi-layer circuit board comprising:

applying metal foil circuit patterns to the top and bottom surfaces of a prepreg to form an inner substrate;

applying a plurality of prepregs provided with metal foil circuit patterns on one surface to said inner substrate to form a laminate of alternating layers of prepregs and metal foil circuit patterns;

heating said laminate under pressure to thereby cure said prepregs and bond said metal foil circuit patterns to said prepregs;

forming a plurality of through-holes in said laminate where electrical connections between said metal foil circuit patterns are desired;

applying a colloidal dispersion of ultrafine metal particles of the independent dispersion type to the inner surface and around the circumference of both openings of said through-holes; and heating said laminate to calcine said colloidal dispersion and form a metal particle film of ultrafine metal particles only, said metal particle film being free of resins, binders, and other non-conductive materials.

2. A process for manufacturing a multi-layer circuit board as defined in claim 1 further comprising:

applying a conductive paste to said metal particle film; and heating said laminate to calcine said conductive paste.

3. A process for manufacturing a multi-layer circuit board comprising:

applying metal foil circuit patterns to the top and bottom surfaces of a prepreg to form an inner substrate;

applying a plurality of prepregs provided with metal foil circuit patterns on one surface to said inner substrate to form a laminate of alternating layers of prepregs and metal foil circuit patterns, said prepregs being provided with recesses where electrical connections between said metal foil circuit patterns are desired;

heating said laminate under pressure to thereby cure said prepregs and bond said metal foil circuit patterns to said prepregs;

forming a plurality of through-holes in said laminate where electrical connections between said metal foil circuit patterns are desired; and applying through-hole connection conductors to the inner surface and around both openings of said through-holes.

4. A process for manufacturing a multi-layer circuit board as defined in claim 3 wherein said recesses are formed in said prepreg before said laminate is formed.

5. A process for manufacturing a multi-layer circuit board as defined in claim 3 further comprising:

providing said prepregs with a heat-shrinkable resin material where electrical connections between said metal foil circuit patterns are desired; and heating said laminate to form said recesses in said laminate.

6. A process for manufacturing a multi-layer circuit board as defined in claim 3 further comprising:

providing said prepregs with an expandable porous resin material which generates gas upon decomposition at an elevated temperature where electrical connections between said metal foil circuit patterns are desired; and heating said laminate to form said recesses which are filled with porous resin.

7. A process for manufacturing a multi-layer circuit board as defined in claim 3 wherein said through-hole connection conductors are formed by applying a conductive paste to the inner surface and around the circumference both openings of said through-holes and calcining said conductive paste.

8. A process for manufacturing a multi-layer circuit board as defined in claim 3 wherein said through-hole connection conductors are formed by applying a colloidal dispersion of ultrafine metal particles of the independent dispersion type to the inner surface and around both openings of said through-holes and calcining said colloidal dispersion to form a metal particle film, said metal particle film being free of resins, binders, and other non-conductive materials.

9. A process for manufacturing a multi-layer circuit board as defined in claim 8 further comprising:

applying a conductive paste to said metal particle film; and heating said laminate to calcine said conductive paste.

* * * * *